(12) United States Patent
Yokoo et al.

(10) Patent No.: US 12,094,776 B2
(45) Date of Patent: Sep. 17, 2024

(54) WAFER PROCESSING METHOD

(71) Applicant: DISCO CORPORATION, Tokyo (JP)

(72) Inventors: Susumu Yokoo, Tokyo (JP); Hiroyuki Takahashi, Tokyo (JP); Kentaro Wada, Tokyo (JP); Yoshio Watanabe, Tokyo (JP); Kenji Okazaki, Tokyo (JP); Yoshiteru Nishida, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 350 days.

(21) Appl. No.: 17/447,580

(22) Filed: Sep. 14, 2021

(65) Prior Publication Data

US 2022/0102215 A1 Mar. 31, 2022

(30) Foreign Application Priority Data

Sep. 28, 2020 (JP) ................. 2020-161638

(51) Int. Cl.
*H01L 21/78* (2006.01)
*H01L 21/3065* (2006.01)
*H01L 21/67* (2006.01)

(52) U.S. Cl.
CPC .......... *H01L 21/78* (2013.01); *H01L 21/3065* (2013.01); *H01L 21/67069* (2013.01)

(58) Field of Classification Search
CPC .......... H01L 21/3065; H01L 21/67069; H01L 21/67092; H01L 21/6715; H01L 21/67132; H01L 21/3081; H01L 21/3086; H01L 21/6836; H01L 2221/68327; H01L 21/78–786; H01L 21/3043; H01L 24/97; H01L 2224/97; H01L 24/96; H01L 2224/96
See application file for complete search history.

(56) References Cited

U.S. PATENT DOCUMENTS

2006/0073705 A1 4/2006 Arai et al.
2019/0109173 A1 4/2019 Oba et al.
(Continued)

FOREIGN PATENT DOCUMENTS

JP  2006108428 A  4/2006
JP  2014175610 A  9/2014
(Continued)

OTHER PUBLICATIONS

Office Action issued in counterpart German patent application No. 10 2021 210 260.3, dated Jun. 6, 2023.
(Continued)

*Primary Examiner* — Mohammad A Rahman
(74) *Attorney, Agent, or Firm* — GREER BURNS & CRAIN, LTD.

(57) ABSTRACT

A wafer processing method includes: a resin film coating step of coating an upper surface of a wafer with a water-soluble resin and coating a dicing tape exposed between the wafer and a frame with a water-soluble resin, and solidifying the water-soluble resin to form a resin film, a partial resin film removing step of removing the resin film from regions to be divided of the wafer to partially expose the upper surface of the wafer, an etching step of subjecting the regions to be divided of the wafer to plasma etching to divide the wafer into individual device chips, and a whole resin film removing step of cleaning a frame unit to remove wholly the resin film.

10 Claims, 6 Drawing Sheets

(56) References Cited

U.S. PATENT DOCUMENTS

2019/0371667 A1    12/2019  Westerman et al.
2019/0371669 A1    12/2019  Karasaki et al.
2020/0185275 A1*   6/2020   Lan .................... H01L 21/6836

FOREIGN PATENT DOCUMENTS

| JP | 2014220410 A | 11/2014 |
| JP | 2017092379 A | 5/2017 |
| JP | 2020043118 A | 3/2020 |
| JP | 2020088177 A | 6/2020 |

OTHER PUBLICATIONS

Search report issued in counterpart Singapore patent application No. 10202109753Q, dated Nov. 8, 2022.
Office Action issued in Japanese Patent Application No. 2020-161638, dated Jun. 17, 2024.

* cited by examiner

WAFER PROCESSING METHOD

BACKGROUND OF THE INVENTION

Field of the Invention

The present invention relates to a wafer processing method for dividing a wafer into individual device chips by plasma etching using a fluorine-based gas.

Description of the Related Art

A wafer formed on a front surface thereof with a plurality of devices such as integrated circuits (ICs) and large scale integrations (LSIs) while partitioned by a plurality of intersecting streets is divided by a dicing apparatus into individual device chips, and the divided device chips are used for electric apparatuses such as mobile phones and personal computers.

In addition, in order to enhance die strength of the device chips, a technology of covering an upper surface of the wafer with a mask exposing the streets and subjecting the streets to plasma etching using a fluorine-based gas to divide the wafer into individual device chips has been proposed by the present applicant (see Japanese Patent Laid-Open No. 2006-108428).

SUMMARY OF THE INVENTION

In the technology described in Japanese Patent Laid-Open No. 2006-108428, the wafer is positioned at an opening of an annular frame provided in the center with the opening for accommodating the wafer, a dicing tape is attached to a lower surface of the wafer and the annular frame to form a frame unit, after which the upper surface of the wafer is covered with a mask and subjected to plasma etching, to divide the wafer into device chips. As a result, the wafer divided into the individual device chips can be conveyed efficiently.

In the case where the wafer is divided by the abovementioned technology, the fluorine element generated when the plasma etching is conducted is deposited on the dicing tape, and cannot be completely removed even when cleaned, but would remain on the dicing tape. Therefore, when the frame unit holding the wafer through the dicing tape is conveyed to a later step, there is a problem that the dicing tape serves as a contamination source including the fluorine element.

Accordingly, it is an object of the present invention to provide a wafer processing method with which it is ensured that even when plasma etching is applied to divide a wafer into device chips, the fluorine element is not left on the dicing tape, and a problem that the dicing tape serves as a contamination source in later steps can be solved.

In accordance with an aspect of the present invention, there is provided a wafer processing method for dividing a wafer into individual device chips by plasma etching using a fluorine-based gas, the wafer processing method including a frame unit forming step of positioning the wafer at an opening of an annular frame provided in a center with the opening for accommodating the wafer and attaching a dicing tape to a lower surface of the wafer and the annular frame to form a frame unit, a resin film coating step of coating an upper surface of the wafer with a water-soluble resin and coating the dicing tape exposed between the wafer and the annular frame with a water-soluble resin, and solidifying the water-soluble resin to form a resin film, a partial resin film removing step of removing the resin film from regions to be divided of the wafer to partially expose the upper surface of the wafer, an etching step of subjecting the regions to be divided of the wafer to plasma etching to divide the wafer into the individual device chips, and a whole resin film removing step of cleaning the frame unit to remove wholly the resin film.

Preferably, the fluorine-based gas is selected from the group consisting of $SF_6$, $CF_4$, $C_2F_6$, and $C_2F_4$, and the wafer has a plurality of devices formed on the upper surface thereof while partitioned by a plurality of intersecting streets.

According to the wafer processing method of the present invention, the fluorine element is captured by the resin film and is removed together with the resin by cleaning, and is not deposited on the dicing tape, so that the problem that the frame unit serves as a contamination source is dissolved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
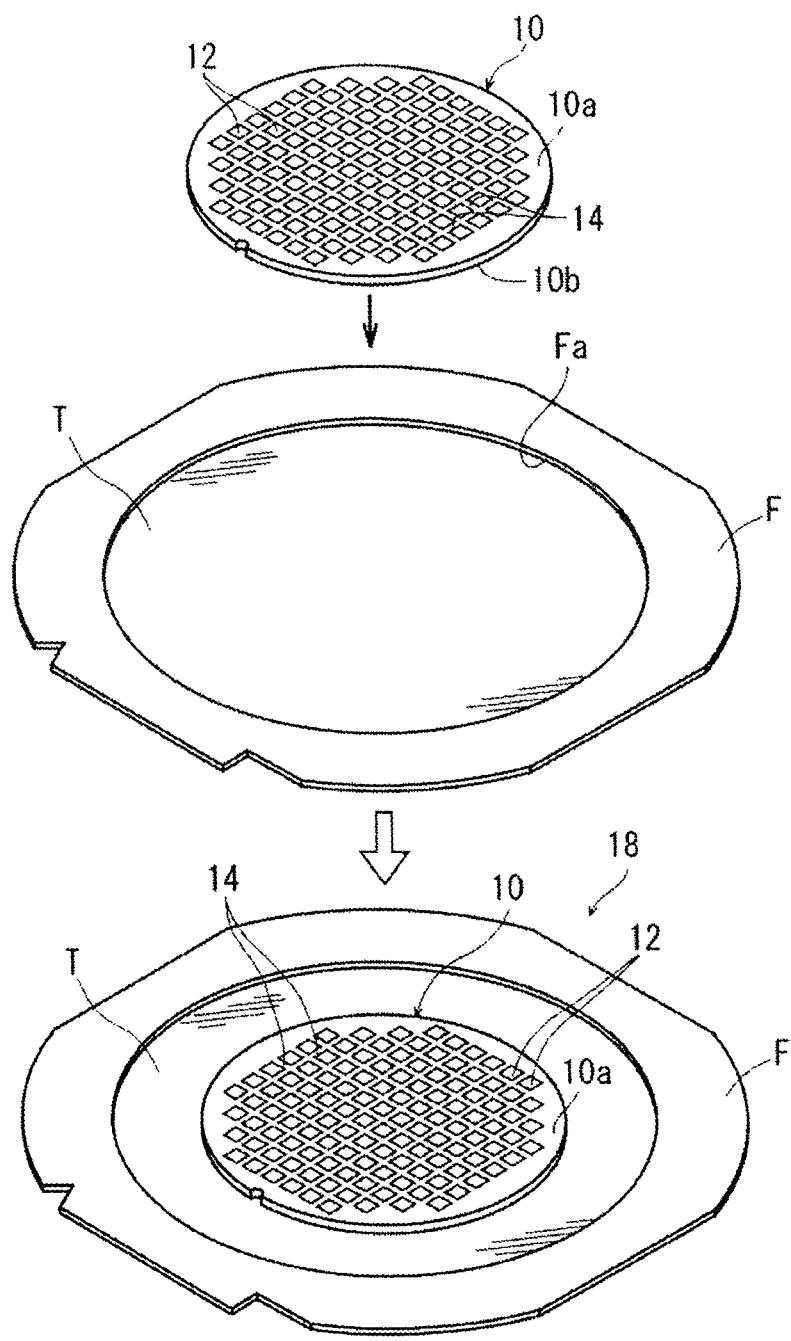
FIG. 1 is a perspective view depicting an embodiment of a frame unit forming step.

A wafer processing method according to an embodiment of the present invention will be described in detail below referring to the attached drawings. FIG. 1 illustrates a wafer 10 as a workpiece in the present embodiment. The wafer 10 is, for example, a silicon wafer formed on a front surface 10*a* thereof with a plurality of devices 12 such as, for example, ICs and LSIs while partitioned by a plurality of intersecting streets 14. In carrying out the wafer processing method of the present embodiment, an annular frame (hereinafter referred to simply as a frame) F provided in the center with an opening Fa for accommodating the wafer 10 is prepared, the wafer 10 is positioned at the opening Fa of the frame F, a dicing tape T is attached to a lower surface 10*b* of the wafer 10 and the frame F, and they are integrated to form a frame unit 18 (frame unit forming step).

Next, an upper surface (in the present embodiment, the front surface 10*a*) of the wafer 10 is coated with a water-soluble resin, the dicing tape T exposed between the wafer 10 and the frame F is coated with a water-soluble resin, and the water-soluble resin is solidified to form a resin film (rein film coating step).

The abovementioned resin film coating step will be described more specifically referring to FIGS. 2 and 3. In carrying out the resin film coating step, the abovementioned frame unit 18 is conveyed to a spin coater 20 depicted in FIG. 2.

Figure 2:
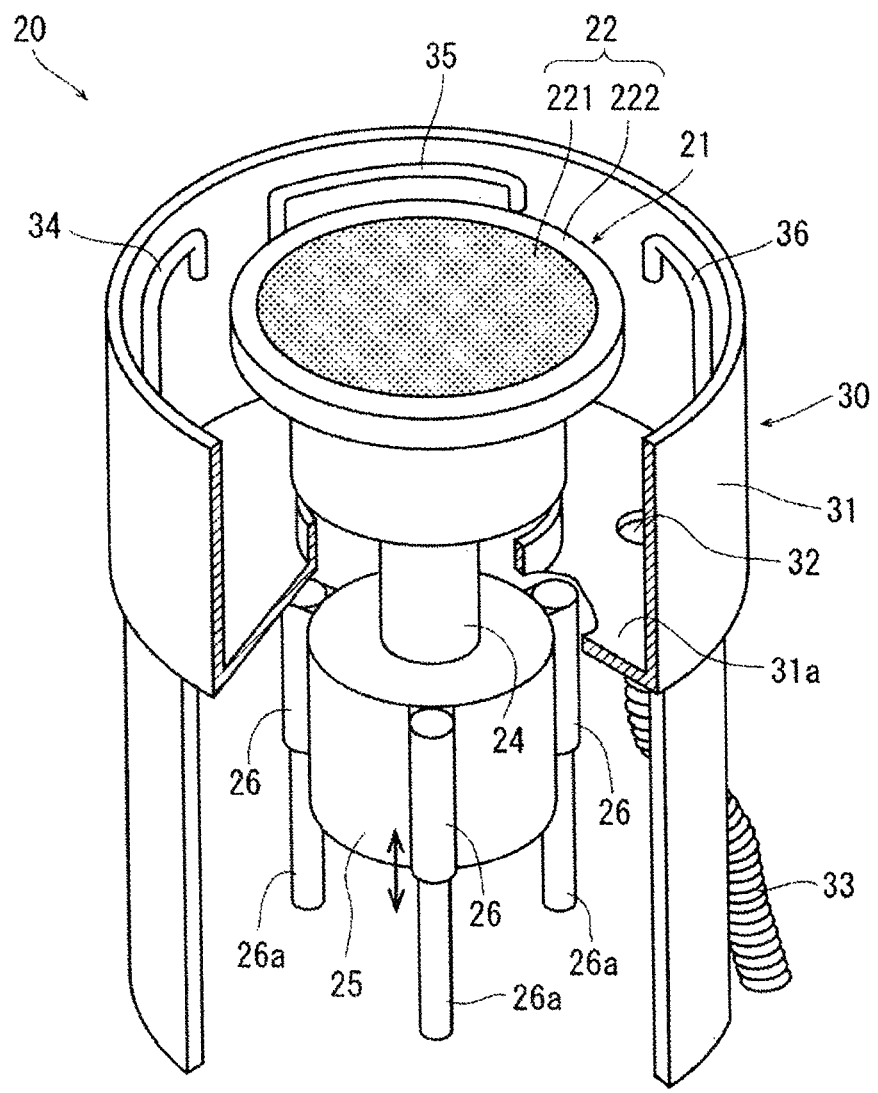
FIG. 2 is a perspective view of a spin coater.

As depicted in FIG. 2, the spin coater 20 includes a table mechanism 21, and a cover section 30 surrounding the table mechanism 21. Note that FIG. 2 is a perspective view of the spin coater 20, and, for convenience of explanation, a part on the viewer's side of a liquid cover 31 constituting the cover section 30 is depicted in a cut-out state. As understood from FIG. 2, the table mechanism 21 includes a table 22 for holding the frame unit 18. The table 22 includes a suction chuck 221 formed of a porous material having gas permeability, and a frame section 222 surrounding the suction chuck 221, and the suction chuck 221 is connected to a suction source (omitted in illustration) and supplied with a suction negative pressure. Further, the table mechanism 21 includes a shaft section 24, and is connected to a drive source 25 through a rotary shaft (omitted in illustration) accommodated in the inside of the shaft section 24. The rotary shaft is driven by an electric motor (omitted in illustration) accommodated in the drive source 25, and drives the table 22 to rotate. A plurality of air pistons 26 are disposed in the periphery of the drive source 25, and rods 26a are advanced and retracted in the vertical direction indicated by an arrow in the figure, whereby the table 22, the shaft section 24, and the drive source 25 are integrally lifted upward and downward. The shaft section 24 and the drive source 25 function as a base for supporting the table 22.

A drain hole 32 for draining the liquid jetted to the inside of the liquid cover 31 is disposed at a bottom surface 31a inside the liquid cover 31, and a drain hose 33 for draining the liquid to a disposal tank (omitted in illustration) disposed in the exterior of the liquid cover 31 is connected to the drain hole 32. Further, a water-soluble resin supply nozzle 34 that supplies in a liquid state a water-soluble resin (for example, polyvinyl alcohol (PVA)) to an upper surface of the wafer 10 held on the table 22, an air jet nozzle 35 that jets air to the upper surface of the wafer 10, and a cleaning liquid supply nozzle 36 that jets a cleaning liquid from the upper side of the wafer 10 are disposed at the bottom surface 31a of the liquid cover 31, in such a manner as to surround the table 22. The water-soluble resin supply nozzle 34, the air jet nozzle 35, and the cleaning liquid supply nozzle 36 abovementioned have nozzle tip portions capable of being moved in a horizontal direction on the upper side of the table 22 by operating driving means (omitted in illustration) disposed on the back surface side of the bottom surface 31a of the liquid cover 31. As depicted in FIG. 2, in a state in which the table 22 is positioned at a position (raised position) where the wafer 10 is conveyed in or conveyed out, the water-soluble resin supply nozzle 34, the air jet nozzle 35, and the cleaning liquid supply nozzle 36 are positioned at accommodated positions in the direction on the periphery side.

Figure 3:
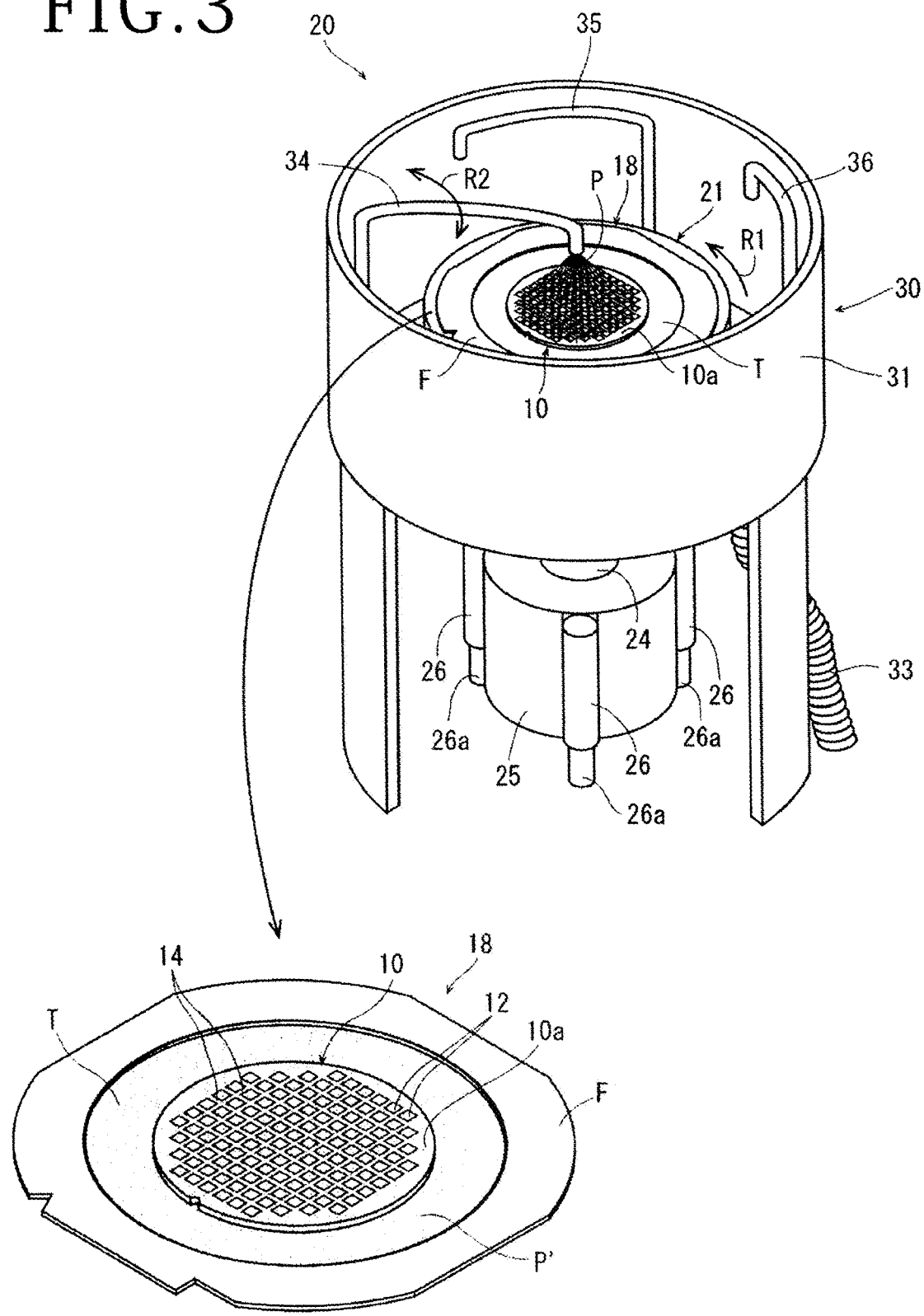
FIG. 3 is a perspective view depicting an embodiment of a resin film coating step.

As depicted in FIG. 3, the frame unit 18 conveyed to the spin coater 20 is mounted on the table 22, and is held under suction by operating the suction source (omitted in illustration). After the frame unit 18 is held under suction, the air pistons 26 are operated, to lower the frame unit 18 to a processed position as depicted in FIG. 3. Next, the electric motor disposed inside the drive source 25 is driven to rotate the frame unit 18 in the direction indicated by an arrow R1 at a predetermined rotational speed (for example, 300 rpm), and, while swinging the water-soluble resin supply nozzle 34 in the direction (horizontal direction) indicated by an arrow R2 in the figure, a water-soluble resin P is jetted, to supply a predetermined amount of the water-soluble resin P (for example, PVA) onto the upper surface (front surface 10a) of the wafer 10 and onto the dicing tape T exposed between the wafer 10 and the frame F. Note that, though illustration is omitted, a lid member is disposed on the upper side of the spin coater 20, and in the case of jetting the liquid, air and the like from the water-soluble resin supply nozzle 34, the air jet nozzle 35, and the cleaning liquid supply nozzle 36, the upper side of the cover section 30 is closed with the lid member.

After the water-soluble resin P is applied to the upper surface of the wafer 10 and the dicing tape T as described above and is uniformly supplied to the whole of the upper surface of the wafer 10 by a centrifugal force, a predetermined period of time is elapsed, whereby the liquid water-soluble resin P is solidified, to form a resin film P' coating the upper surface of the wafer 10 and the dicing tape T exposed between the wafer 10 and the frame F, as depicted on the lower side in FIG. 3. By the foregoing, the resin film coating step is completed.

Next, a partial resin film removing step is carried out in which the resin film P' is removed from the regions to be divided of the wafer 10 (in the present embodiment, the streets 14), to partially expose the upper surface (front surface 10a) of the wafer 10. The partial resin film removing step will be described referring to FIGS. 4A and 4B.

Figure 4A:
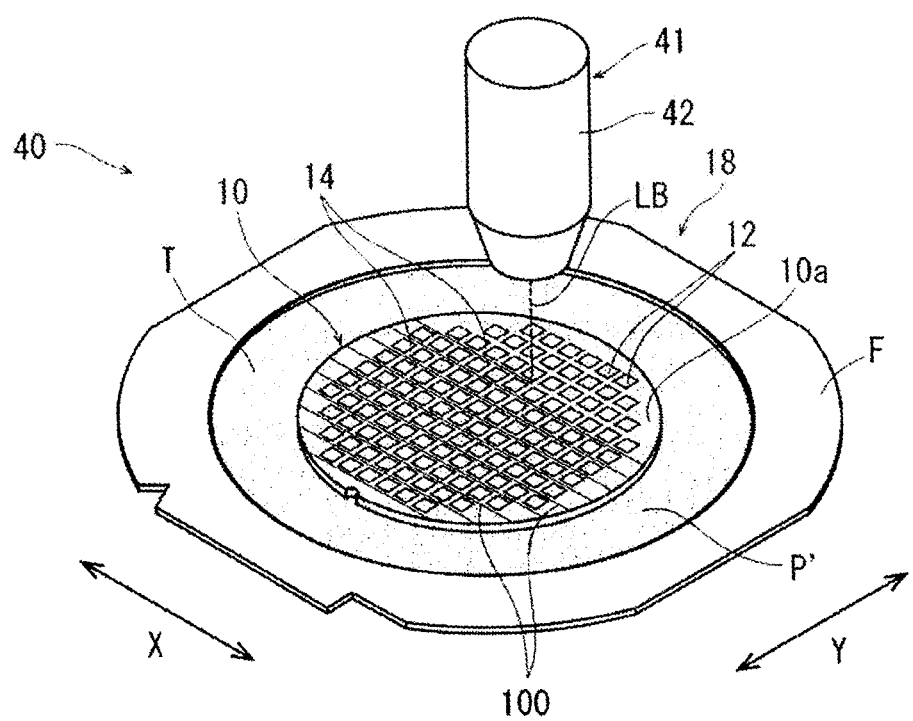
FIG. 4A is a perspective view depicting an embodiment of a partial resin film removing step.

The frame unit 18 formed with the resin film P' on the upper surface of the wafer 10 and on the dicing tape T by performing the resin film coating step is conveyed to a laser processing apparatus 40 (only a part thereof is illustrated) depicted in FIG. 4A. The laser processing apparatus 40 includes at least a chuck table (omitted in illustration) that holds the frame unit 18, a moving mechanism (omitted in illustration) that rotationally drives the chuck table and moves the chuck table in an X-axis direction and a Y-axis direction, an alignment unit (omitted in illustration), and a laser beam applying unit 41. The laser beam applying unit 41 emits a laser beam LB, and includes an optical system (omitted in illustration) that adjusts the output of the laser beam LB and guides the laser beam LB to a light concentrator 42.

The frame unit 18 conveyed to the laser processing apparatus 40 is mounted on the chuck table and held under suction. Next, the moving mechanism is operated to move the wafer 10 of the frame unit 18 to a position directly below the alignment unit, the wafer 10 is imaged by the alignment unit, and a predetermined laser processing position (street 14) is detected. Subsequently, the moving mechanism is operated to move the frame unit 18 to a position directly below the light concentrator 42 of the laser beam applying unit 41, a focal point is positioned at the resin film P' coating the street 14 of the front surface 10a of the wafer 10, and, while moving the wafer 10 in the X-axis direction in the figure, the laser beam LB is applied along the street 14. The laser beam LB applied in this instance has such a wavelength as to be absorbed by the resin film P', and is set to have such an output as not to subject the front surface 10a of the wafer 10 to ablation.

Figure 4B:
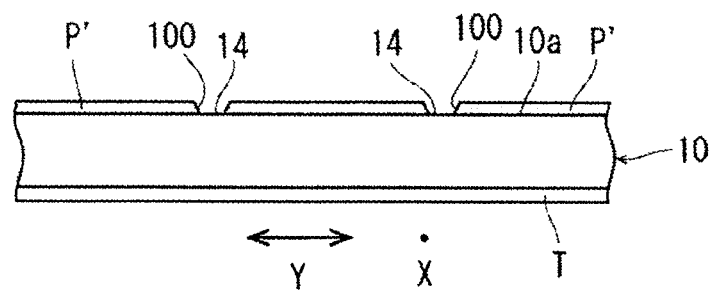
FIG. 4B is a partial enlarged sectional view of a wafer in a state in which the partial resin film removing step depicted in FIG. 4A is being carried out.

With the abovementioned laser beam LB applied, as depicted in FIG. 4B, the resin film P' is removed from the region to be divided of the wafer 10, namely, the street 14, to form an exposed groove 100 where the front surface 10a of the wafer 10 is exposed along the street 14. After the exposed groove 100 is formed along the predetermined street 14 formed in a first direction, the moving mechanism is operated to put the wafer 10 into indexing feeding in the Y-axis direction, and the abovementioned laser beam LB is applied, whereby the exposed grooves 100 are formed along all the streets 14 formed in the first direction. Next, the chuck table is rotated by 90 degrees, the street 14 along a second direction orthogonal to the streets 14 previously formed with the exposed grooves 100 is aligned to the X-axis direction, and, similarly to the abovementioned, the laser beam LB is applied along all the streets 14 along the second direction, to form the exposed grooves 100. By the foregoing, the exposed grooves 100 are formed along all the streets 14 formed on the front surface 10a of the wafer 10, and the partial resin film removing step is completed.

After the abovementioned partial resin film removing step is carried out, next, an etching step is performed in which plasma etching is conducted along the regions to be divided of the wafer 10, namely, along the streets 14. The etching step will be described more specifically referring to FIGS. 5A and 5B.

Figure 5A:
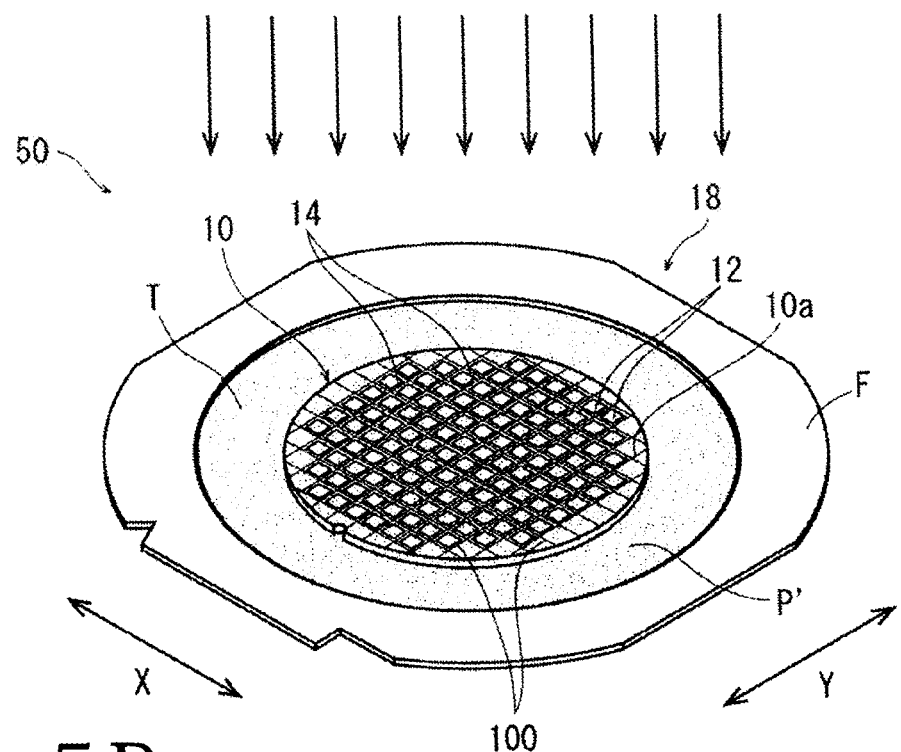
FIG. 5A is a perspective view depicting an embodiment of an etching step.

After the partial resin film removing step is performed as described above, the frame unit 18 is conveyed to a plasma apparatus 50 omitted in detailed illustration, as depicted in FIG. 5A. As the plasma apparatus 50, a known plasma apparatus can be used. For example, the plasma apparatus 50 includes an etching chamber forming a hermetically sealed space, an upper electrode and a lower electrode disposed in the etching chamber, a gas supply unit that jets an etching gas from the upper electrode side toward the lower electrode side inside the etching chamber, and the like (these members are all omitted in illustration). Here, the frame unit 18 having undergone the partial resin film removing step is mounted and held between the upper electrode and the lower electrode, with the front surface 10a side of the wafer 10 directed upward, a fluorine-based gas as an etching gas is supplied to the inside of the etching chamber, and a high-frequency electric power for generating a plasma is applied to the upper electrode. Note that the fluorine-based gas is selected from among, for example, $SF_6$, $CF_4$, $C_2F_6$, and $C_2F_4$.

Figure 5B:
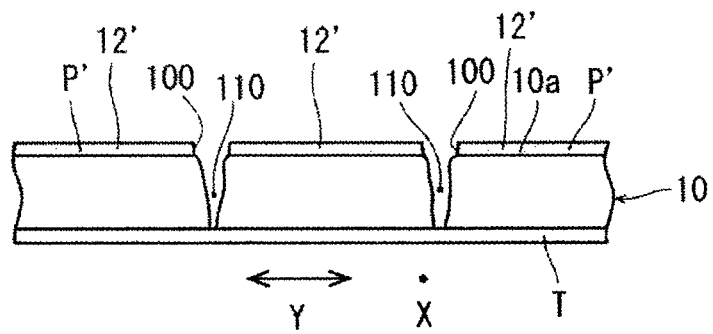
FIG. 5B is a partial enlarged sectional view of a wafer in a state in which the etching step depicted in FIG. 5A is being carried out.

Then, a plasmatized etching gas is generated in the space between the upper electrode and the lower electrode, and the plasmatized etching gas is supplied to the wafer 10 side. Here, the frame unit 18 conveyed to the plasma apparatus 50 by having undergone the abovementioned partial resin film removing step is protected by the resin film P' in the regions exclusive of the abovementioned exposed grooves 100. As a result, in the abovementioned plasma apparatus 50, as depicted in FIG. 5B, plasma etching is applied along the exposed grooves 100, namely, along the streets 14, to form division grooves 110 reaching the dicing tape T, whereby the wafer 10 is divided into individual device chips 12', and the etching step is completed.

After the abovementioned etching step is performed, a whole resin film removing step is carried out in which the frame unit 18 is cleaned to remove wholly the resin film P'. The whole resin film removing step will be described more specifically referring to FIG. 6.

Figure 6:
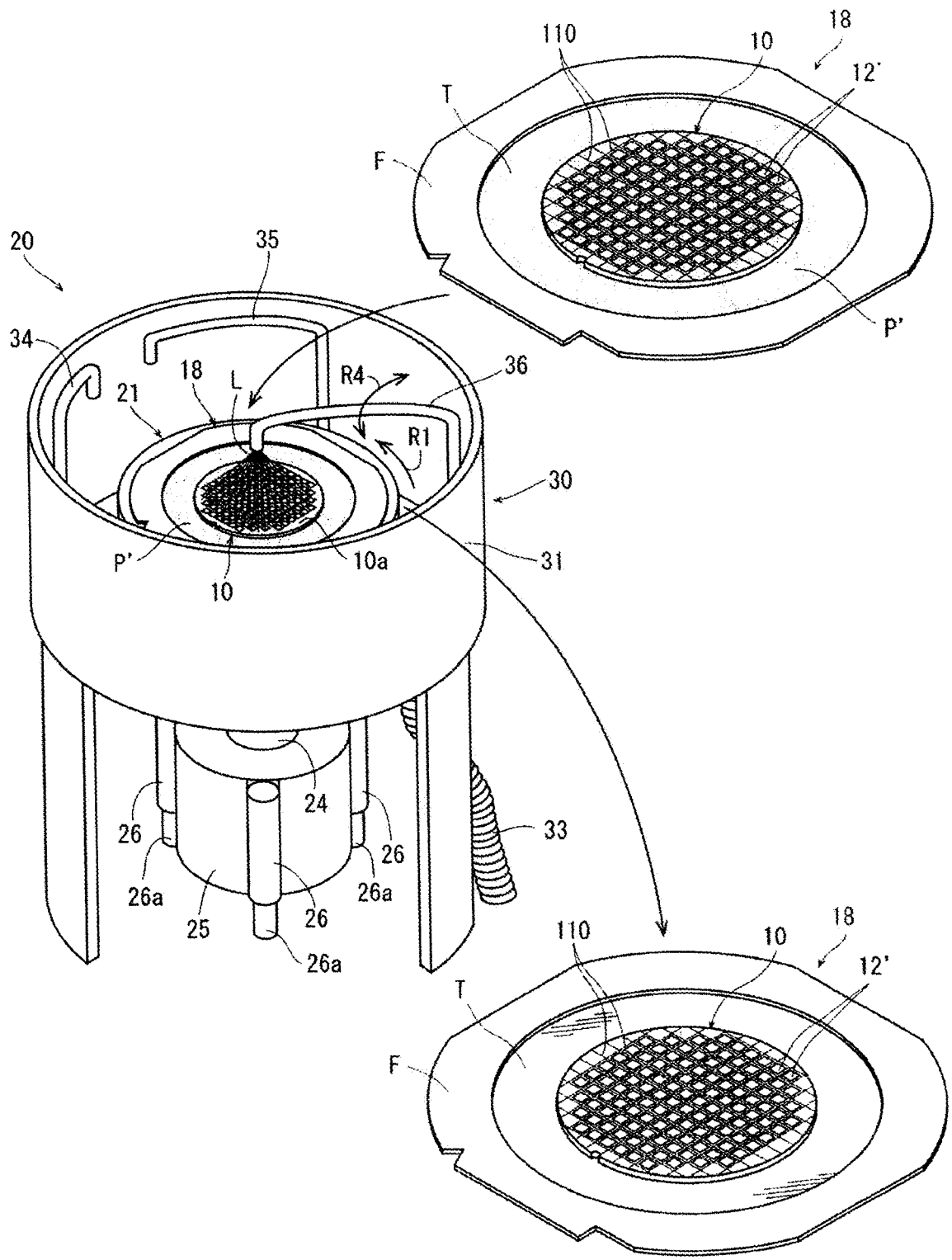
FIG. 6 is a perspective view depicting an embodiment of a whole resin film removing step.

The frame unit 18 having undergone the etching step depicted on the right upper side in FIG. 6 is conveyed to the abovementioned spin coater 20, is mounted on the table mechanism 21, with the front surface 10a side of the wafer 10 directed upward, and is held under suction. Next, the electric motor disposed in the drive source 25 is driven, to rotate the table mechanism 21 in the direction indicated by an arrow R3 at a predetermined rotational speed (for example, 300 rpm), and, while the cleaning liquid supply nozzle 36 is swung in the direction (horizontal direction) indicated by an arrow R4 in the figure, a cleaning liquid L (for example, pure water) is jetted to the upper surface (front surface 10a) of the wafer 10 and the dicing tape T for a predetermined period of time. As a result, the resin film P' coating the wafer 10 and the dicing tape T is dissolved and is discharged into the liquid cover 31. The resin film P' dissolved and discharged flows on the bottom surface 31a of the liquid cover 31, and is accommodated into a predetermined disposal tank through the drain hole 32 and the drain hose 33. Next, the cleaning liquid supply nozzle 36 is retracted to an accommodated position, the air jet nozzle 35 is operated to move a tip of the air jet nozzle 35 to a central region on the wafer 10, air is jetted toward the front surface 10a side of the wafer 10, and, while swinging the tip in a horizontal direction (omitted in illustration), the table mechanism 21 is rotated at a high speed (for example, 3,000 rpm), and the upper side of the frame unit 18 inclusive of the front surface 10a of the wafer 10 is dried, to complete the whole resin film removing step. With the whole resin film removing step carried out, the fluorine element remaining on the frame unit 18 is captured by the dissolved resin film P' and is discharged together with the resin film P', and is accommodated in the disposal tank through the drain hose 33 without depositing on the dicing tape T.

After the whole resin film removing step is carried out as described above, the frame unit 18 is conveyed out from the spin coater 20, and is conveyed to the next step, for example, a pick-up device that picks up the device chips 12' individually divided from the frame unit 18, as depicted on the right lower side in FIG. 6. In this instance, the fluorine element does not remain on the wafer 10 and the dicing tape T, so that the problem that the remaining fluorine element may serve as a contamination source for contaminating the regions subjected to the later steps is solved.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into individual device chips by plasma etching using a fluorine-based gas, the wafer processing method comprising:
   a frame unit forming step of positioning the wafer at an opening of an annular frame provided in a center with the opening for accommodating the wafer and attaching a dicing tape to a lower surface of the wafer and the annular frame to form a frame unit;
   a resin film coating step of coating, with a water-soluble resin, an upper surface of the wafer and an area of the dicing tape exposed between the wafer and the annular frame, and solidifying the water-soluble resin to form a resin film that covers both the upper surface of the wafer and the area of the dicing tape exposed between the wafer and the annular frame;
   a partial resin film removing step of removing the resin film from regions to be divided of the wafer to partially expose the upper surface of the wafer;
   an etching step of subjecting the regions to be divided of the wafer to plasma etching to divide the wafer into the individual device chips; and
   a whole resin film removing step of cleaning the frame unit to remove wholly the resin film.

2. The wafer processing method according to claim 1, wherein the fluorine-based gas is selected from the group consisting of $SF_6$, $CF_4$, $C_2F_6$, and $C_2F_4$, and the wafer has a plurality of devices formed on the upper surface thereof while partitioned by streets.

3. The wafer processing method according to claim 1, wherein the resin film forming step is performed while the frame unit is held under suction on a porous suction chuck of a table associated with a spin coater.

4. The wafer processing method according to claim 1, wherein the resin film forming step is performed while the dicing tape extends generally horizontally.

5. The wafer processing method according to claim 1, wherein the resin film forming step is performed while the area of the dicing tape exposed between the wafer and the annular frame extends generally horizontally.

6. A wafer processing method for dividing a wafer into individual device chips by plasma etching using a fluorine-based gas, the wafer processing method comprising:
- a frame unit forming step of positioning the wafer at an opening of an annular frame provided in a center with the opening for accommodating the wafer and attaching a dicing tape to a lower surface of the wafer and the annular frame to form a frame unit;
- a resin film coating step of coating, with a water-soluble resin jetted from a nozzle, an upper surface of the wafer and an area of the dicing tape exposed between the wafer and the annular frame, and solidifying the water-soluble resin to form a resin film that fully covers both the upper surface of the wafer and the area of the dicing tape exposed between the wafer and the annular frame;
- a partial resin film removing step of removing the resin film from regions to be divided of the wafer to partially expose the upper surface of the wafer;
- an etching step of subjecting the regions to be divided of the wafer to plasma etching to divide the wafer into the individual device chips; and
- a whole resin film removing step of cleaning the frame unit to remove wholly the resin film, and
- wherein during the resin film coating step, the nozzle is moved along a path provided above both the wafer and the area of the dicing tape exposed between the wafer and the annular frame.

7. The wafer processing method according to claim 6, wherein the fluorine-based gas is selected from the group consisting of $SF_6$, $CF_4$, $C_2F_6$, and $C_2F_4$, and the wafer has a plurality of devices formed on the upper surface thereof while partitioned by streets.

8. The wafer processing method according to claim 6, wherein the resin film forming step is performed while the frame unit is held under suction on a porous suction chuck of a table associated with a spin coater.

9. The wafer processing method according to claim 6, wherein the resin film forming step is performed while the dicing tape extends generally horizontally.

10. The wafer processing method according to claim 6, wherein the resin film forming step is performed while the area of the dicing tape exposed between the wafer and the annular frame extends generally horizontally.

* * * * *